(12) United States Patent
Enriquez

(10) Patent No.: US 6,344,776 B1
(45) Date of Patent: Feb. 5, 2002

(54) TRANSISTOR BASE CURRENT ERROR CORRECTION SCHEME FOR LOW OVERHEAD VOLTAGE APPLICATIONS

(75) Inventor: Leonal Ernesto Enriquez, Melbourne Beach, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/686,634

(22) Filed: Oct. 11, 2000

(51) Int. Cl.$^7$ ................................................. H03F 3/04
(52) U.S. Cl. ........................................ 330/288; 323/315
(58) Field of Search ......................... 330/288; 323/315, 323/316

(56) References Cited

U.S. PATENT DOCUMENTS 5,311,146 A * 5/1994 Brannon et al. ............ 330/228

* cited by examiner

*Primary Examiner*—Robert Pascal
*Assistant Examiner*—Henry Choe
(74) *Attorney, Agent, or Firm*—Allen, Dyer, Doppelt, Mlibrath & Gilchrist, P.A.

(57) ABSTRACT

To mitigate against base current errors in a current mirror circuit that has limited overhead voltage, a compensated current mirror circuit includes complementary polarity, base current error compensation circuits coupled to a current mirror control node, referenced to the collector-emitter current path of an input transistor. To compensate for total number of base current error components in the output transistor-based mirror circuit, auxiliary transistors are coupled in the collector-emitter paths of the current mirror output transistors, referenced to a relatively large voltage well in excess of the supply rail, to provide ample output current path headroom for the insertion of the auxiliary transistors. By summing and mirroring the base offset currents of these auxiliary transistors back to the control node, the output current mirror transistors are driven with a composite current that makes their output currents equal with the input current and effectively free of base current errors.

11 Claims, 1 Drawing Sheet

TRANSISTOR BASE CURRENT ERROR CORRECTION SCHEME FOR LOW OVERHEAD VOLTAGE APPLICATIONS

FIELD OF THE INVENTION

The present invention relates in general to electronic circuits, and is particularly directed to new and improved transistor circuit architecture for correcting for base current errors or offsets in a low voltage application such as, but not limited to the, coupling of a subscriber line interface circuit to a low voltage codec.

BACKGROUND OF THE INVENTION

Systems employed by telecommunication service providers contain what are known as subscriber line interface circuits or 'SLIC's, which interface communication signals with tip and ring leads of a wireline pair serving a relatively remote piece of subscriber communication equipment. In order to be interfaced with a variety of telecommunication circuits, including those providing codec functionality, present day SLICs must conform with a very demanding set of performance requirements, including accuracy, linearity, insensitivity to common mode signals, low noise, low power consumption, filtering, and ease of impedance matching programmability.

Indeed, as designers of integrated circuits employed for digital communications, such as codecs and the like, continue to 'lower the voltage supply rail bar' requirements for their devices (e.g., from five volts down to three volts), through the use of differential voltage-based implementations, the communication service provider is faced with the problem that such low voltage restrictions may not provide sufficient voltage headroom to accommodate a low impedance-interface with existing SLICs (which may be designed to operate at a VCC supply rail of five volts).

This limited voltage headroom problem may be illustrated by considering a conventional current mirror architecture, shown in FIG. 1, as may be employed in a subscriber line interface circuit, and which is designed to operate with a customary VCC supply rail of five volts. As shown therein, the current mirror comprises an input NPN transistor 10 having its base 11 coupled to a voltage reference $V_{REF}$, and its emitter 12 coupled to receive an emitter current $I_{12}$ or input current $I_{in}$, from a communication device, such as a codec, interfaced therewith. The collector 13 of the input NPN transistor 10 is coupled in common to the collector 23 of a first current mirror input PNP transistor 20, and to the base 31 of a base-offset PNP transistor 30, the collector 33 of which is coupled to a voltage reference terminal, such as ground (GND). The emitter 32 of PNP transistor 30 is coupled in common to the base 21 of current mirror output transistor 20 and to the base 41 of a PNP current mirror output transistor 40. The emitters 22 and 42 of current mirror transistors 20 and 40, respectively, are coupled through resistors 24 and 44 to a (VCC) voltage supply rail 16, while the collector 43 of the current mirror output transistor 40 is coupled to an output terminal 45, from which an output current $I_{out}$ is derived.

While the current mirror circuit of FIG. 1 works well when powered by its designed supply rail voltage VCC of five volts, when interfaced with a reduced voltage circuit, such as a differential voltage-based codec operating at a VCC rail value on the order of only three volts and a reference voltage $V_{REF}$ of only half that (e.g., on the order of 1.5 to 1.6 volts), the input NPN transistor 10 lacks sufficient overhead for proper circuit operation. Also, even though the mirrored output $I_{out}$ at output node 45 is first order compensated for PNP base current errors, it is not compensated for the NPN base current error in input transistor 10.

More particularly, the mirrored output current $I_{out}$ at the current mirror's output terminal 45 corresponds to the collector current $I_{43}$ flowing out of the collector 43 of the current mirror transistor 40, which may be defined as:

$$I_{out}=I_{43}=\alpha_{NPN10}I_{12}-2I_{12}/\beta_{PNP}^2,$$

or $$I_{out}=I_{12}(\alpha_{NPN10}-2/\beta_{PNP}^2),$$

so that $I_{out}$ may be approximated as:

$$I_{out}=I_{in}(1-1/\beta_{NPN}). \quad (1)$$

From equation (1), it can be seen that the mirrored output current $I_{out}$ at the collector 43 of current mirror transistor 40 not only includes the input current $I_{in}$, as desired, but it includes a base current error component $I_{in}/\beta_{NPN}$ associated with the NPN input transistor 10, which is undesired. Because of the extremely tight voltage tolerances associated with the use of the lower VCC supply rail voltage and reference voltage $V_{REF}$, there is no available headroom in the collector-emitter current flow path through transistors 10–20 and the VCC supply rail for the insertion of an NPN base current error compensating circuit.

SUMMARY OF THE INVENTION

In accordance with the present invention, this base current error problem is successfully addressed by means of a compound multiple transistor polarity (PNP and NPN) base current error correction architecture, that is configured around an initial assumption that all transistors of a first polarity transistor type of current mirror output transistor (e.g., PNP for the case of a current mirror employing PNP current mirror output transistors, as a non-limiting example) will be properly compensated for PNP base current errors.

Based upon this initial premise, an NPN base current error compensation mirror circuit, referenced to the collector-emitter current path of an NPN input transistor coupled to a control node used to drive the PNP current mirror transistors, is configured to mirror a first, NPN base current offset to the control node. To compensate for total number of base current error components in the output PNP transistor-based mirror circuit, auxiliary PNP transistors are coupled in the collector-emitter paths of the current mirror PNP transistors and the output current mirror's output ports. Because the output ports are referenced to a relatively large voltage (e.g., $V_{BAT}$), there is sufficient headroom in the collector-emitter paths of the current mirror PNP transistors for the insertion of the auxiliary PNP transistors.

Base offset currents of these auxiliary transistors are summed and mirrored back to the control node by a multiplication factor that is defined in accordance with the base error currents associated with the total mirrored output current produced at the collectors of the current mirror output transistors. As a result, the control node is supplied with a composite (NPN and PNP base error compensated) current mirror control current which, when applied to the output current mirror transistors, causes each of their respective output currents to be effectively equal to the input current (namely, containing no base current error component).

DETAILED DESCRIPTION

Figure 1:
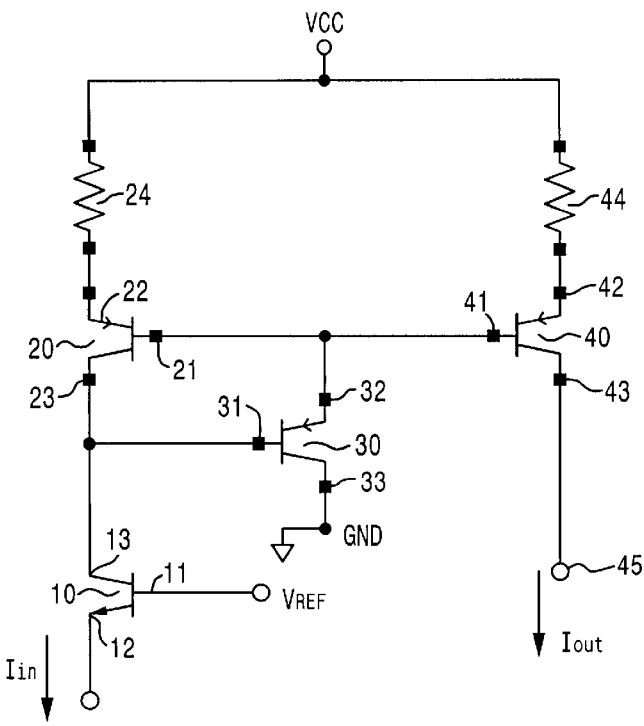
FIG. 1 is a schematic illustration of a conventional current mirror circuit in which the mirrored output current is first order compensated only for PNP base current errors.
Figure 2:
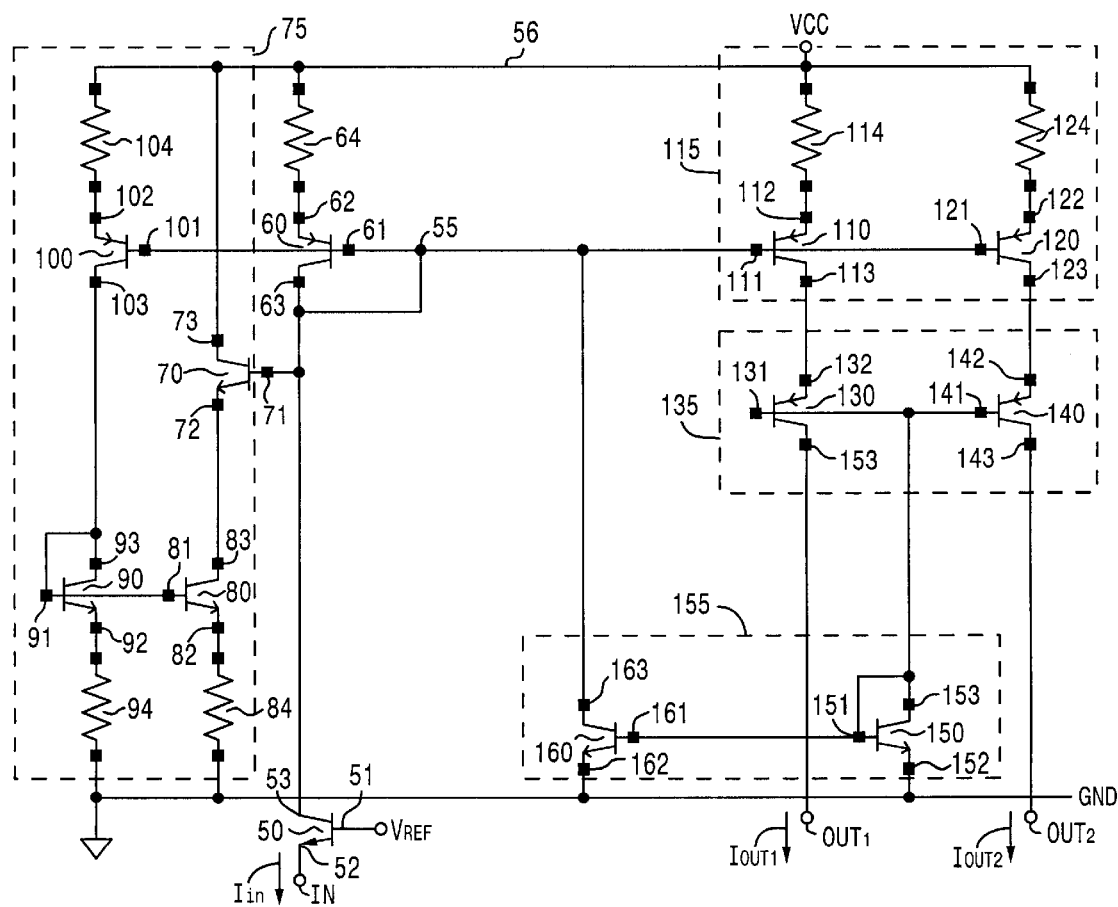
FIG. 2 is a schematic illustration of a current mirror circuit employing the complementary (PNP and NPN) base current error minimization scheme of the present invention.

Attention is now directed to FIG. 2 which schematically shows a current mirror circuit employing the complementary (PNP and NPN) base current error minimization scheme of the present invention. For purposes of providing a non-limiting example, the current mirror of FIG. 2 is configured as a PNP output current mirror transistor-based architecture, with its input interfaced through an NPN transistor to an associated signaling circuit (e.g., codec). It should be understood, however, that the polarities of the transistors may be reversed (with an associated reversal in biasing voltage rails) without a loss in generality.

Moreover, the example of FIG. 2 is shown as having a current input port IN, that is adapted to be coupled to with a relatively low voltage device, such as a codec, and first and second current output ports $OUT_1$ and $OUT_2$, from which respective output currents $I_{out1}$ and $I_{out2}$ are derived. It should be understood, however, that the invention is not limited to use with any a particular number of ports. A two output port circuit has been illustrated in order to reduce the complexity of the drawings. From the description of the illustrated two port device, to follow, the application of the base current error compensation mechanism of the invention to an M output port device is readily determined, as will be explained.

The base current error compensated circuit architecture of FIG. 2 includes an NPN input bipolar transistor 50 having its base 51 coupled to a voltage reference $V_{REF}$, and its emitter 52 coupled to receive an emitter current $I_{52}$ or input current $I_{in}$. As pointed out above, while the current mirror circuit of FIG. 2 may be powered by a supply rail voltage VCC of five volts, the base-error compensation circuitry to be described also allows it to be operated at a reduced supply voltage, such as a VCC on the order of three volts, a reference voltage $V_{REF}$ on the order of only 1.5 volts, as may be encountered in a differential voltage-based codec.

The collector 53 of the input NPN transistor 50 is coupled to a current mirror control node 55, which is connected in common to the collector 63 and the base 61 of a diode-connected current mirror control PNP transistor 60, the emitter 62 of which is coupled through a resistor 64 to a (VCC) voltage supply rail 56.

The current mirror control node is further connected to the base 71 of an NPN base current offset control transistor 70 within an NPN base error compensation current mirror 75. As will be described, the NPN base error compensation current mirror 75 is operative to generate an NPN base error compensating current component that sums with the other current components of the current mirror input current at node 55, so that, when applied to the output current mirror transistors 110 and 120, causes their respective output currents to be effectively equal to the input current without any base current error component.

The collector 73 of NPN transistor 70 is coupled to the VCC voltage supply rail 56, while its emitter 72 is coupled to the collector 83 of an NPN transistor 80. The emitter 82 of NPN transistor 80 is coupled through a resistor 84 to voltage reference terminal (GND). The base 81 of NPN transistor 80 is coupled to the commonly connected base 91 and collector 93 of a diode-connected NPN current mirror transistor 90, having its emitter 92 coupled through a resistor 94 to ground. The collector 93 of NPN transistor 90 is coupled to the collector 103 of a PNP current mirror transistor 100, whose emitter 102 is coupled through a resistor 104 to the VCC voltage supply rail 56. The base 101 of PNP current mirror transistor 100 is coupled to current mirror control node 55.

Current mirror control node 55 is further coupled in common with the base 111 of a first PNP current mirror output transistor 110 and with the base 121 of a second PNP current mirror output transistor 120 of an output current mirror 115. The emitters 112 and 122 of PNP current mirror output transistors 110 and 120, respectively, are coupled through resistors 114 and 124 to the (VCC) voltage supply rail 56. As will be described, PNP current mirror transistors 60, 100, 110 and 120 are matched with one another; also their associated resistors 64, 104, 114 and 124 have the same resistance value.

The collector 113 of the first current mirror output transistor 110 is coupled to the emitter 132 of a first auxiliary current mirror coupling transistor 130 within an auxiliary coupling circuit 135. The collector 133 of transistor 130 is coupled to the first output terminal $OUT_1$. Similarly, the collector 123 of the second current mirror output transistor 120 is coupled to the emitter 142 of a second auxiliary PNP current mirror coupling transistor 140, whose collector 143 is coupled to the second output terminal $OUT_2$. As noted earlier, these output ports are referenced to a relatively large voltage (e.g., $V_{BAT}$), so that there is sufficient headroom in the collector-emitter paths of the current mirror output PNP transistors 110 and 120 for the insertion of their associated auxiliary PNP coupling transistors 130 and 140, respectively.

In order to compensate for total number of base current error components in the output PNP transistor-based mirror circuit, the base currents of auxiliary coupling transistors 130 and 140 are summed and mirrored back to the control node 55 by a feedback current mirror circuit 155 comprised of a diode-connected NPN transistor 150 and an NPN transistor 160. In particular, the base 131 of transistor 130 and the base 141 of transistor 140 are coupled in common to the base 151 and collector 153 of a diode-connected NPN transistor 150, which is coupled in a current mirror configuration with NPN transistor 160. The emitter 152 of NPN transistor 150 and the emitter 162 of NPN transistor 160 are referenced to ground, while their bases 151 and 161 are coupled in common. The collector 163 of NPN transistor 160 is coupled to current mirror control node 55.

As described above, the current mirror parameters of current mirror 155 provide a multiplication factor that is based upon the base error currents associated with the total mirrored output current produced at the collectors of the current mirror output transistors 110 and 120, so that the control node 55 will be supplied with a composite (NPN and PNP base error compensated) current mirror control current which, when applied to the output current mirror transistors 110 and 120, causes the output currents $I_{out1}$ and $I_{out2}$ to be effectively equal to the input current $I_{in}$. An examination of the current mirror circuit of FIG. 2 reveals that in order to take into account all of the PNP base current errors, the ratio M of the emitter area $A_{e160}$ of NPN transistor 160 to the emitter area $A_{e150}$ of NPN transistor 150 needs to be 2.5 (or 5/2).

The circuit of FIG. 2 operates as follows.

An examination of the current mirror architecture of FIG. 2 reveals that the current $I_{64}$ flowing through the resistor 64 connected to the emitter 62 of the PNP base current offset control transistor 60 may be approximated as a summation of the following components:

1—the collector current $I_{53}$ through input NPN transistor 50, which may be expressed as $I_{53}=\alpha_{NPN50}I_{in}$;

2—the base current $I_{75}$ mirrored through the NPN base error compensation current mirror 75 based upon the base current supplied to transistor 70, or $I_{75}\approx I_{in}/(\beta_{NPN70}+1)$;

3—the sum $\Sigma I\beta$ of the three base error currents associated with current mirror transistors 100, 110 and 120, i.e., $\Sigma I\beta=I_{in}*3/\beta_{PNP100,110,120}$; and 4—the output current $I_{155}$ fed back to node 55 by current mirror 155, or $I_{155}=I_{in}*(2/\beta_{PNP130,140})*(A_{e160}/A_{e150}=5/2)$.

Combining these currents yields an equation (2) as:

$$I_{64}=I_{in}*[\beta_{NPN50}/(\beta_{NPN50}+1)+1/(\beta_{NPN70}+1)-3/\beta_{PNP100,110,120}+5/\beta_{PNP130,140}]. \quad (2)$$

For the case that all the PNP transistors of the compensated current mirror circuit of FIG. 2 are effectively matched in terms of their respective betas, and that $\beta_{NPN50}$ matches $\beta_{NPN70}$, then equation (2) may be simplified as:

$$I_{64}I_{in}*[(\beta_{NPN}+1)/(\beta_{NPN}+1)+2/\beta_{PNP}]=I_{in}*[1+2/\beta_{PNP}]. \quad (3)$$

Therefore, as PNP transistors 60, 110 and 120 are matched devices, and with their associated resistors 64, 114 and 124 be equal valued resistors, as described above, then their respective currents $I_{64}$, $I_{114}$ and $I_{124}$ will be the same. Thus, the emitter currents of current mirror transistors 110 and 120, respectively associated with the first and second output ports $OUT_1$ and $OUT_2$, are the same as the emitter current of transistor 60. Namely, $$I_{64}=I_{114}=I_{124}. \quad (4)$$

Also, the output current $I_{out1}$ at the output port $OUT_1$ (which corresponds to the collector current $I_{133}$ of the first auxiliary coupling transistor 130 coupled with the first current mirror output transistor 110) and the output current $I_{out2}$ at the output port $OUT_2$ (which corresponds to the collector current $I_{143}$ of the auxiliary coupling transistor 140 coupled with the second current mirror output transistor 120) may be defined as follows:

$$I_{out1}=\alpha_{PNP}^2 I_{110}, \text{ and } I_{out2}=\alpha_{PNP}^2 I_{120}. \quad (5)$$

However, since $\alpha_{PNP}=\beta_{PNP}/(\beta_{PNP}+1)=1/(1+1/\beta_{PNP})$, so that $$\alpha_{PNP} \text{ may be approximated by } 1/(1-1/\beta_{PNP}), \quad (6)$$

then, for large $\beta_{PNP}$, $$\alpha_{PNP}^2 \text{ may be approximated by } 1-2/\beta_{PNP}). \quad (7)$$

Substituting equations (3), (4) and (7) into equation (5) results in the following expression for the output currents $I_{out1}$ and $I_{out2}$.

$I_{out1}=I_{out2}=I_{in}*(1+2/\beta_{PNP})*(1-2/\beta_{PNP})$, which implies that each of the output currents $I_{out1}$ and $I_{out2}$ has been effectively compensated for base current errors and therefore may be approximated as the input current $I_{in}$.

As pointed out above, although the current mirror example of FIG. 2 has first and second output ports $OUT_1$ and $OUT_2$, it is to be understood that the invention is not limited to this or any particular number of mirrored current outputs. In general, for a total mirrored output current produced at the collectors of the current mirror output transistors, which has a value M times the value of the in input current $I_{in}$, namely, $I_{out\_total}=M*I_{in}$, then the ratio N of the emitter area $A_{e160}$ of NPN transistor 160 to the emitter area $A_{e150}$ of NPN transistor 150 is defined such that:

$$I_{in}-I_{in}*(M+1)/\beta_{PNP}+N*M*I_{in}/\beta_{PNP}=I_{in}+2I_{in}/\beta_{PNP}, \quad (8)$$

which may be rewritten as:

$$I_{in}*[1-((M+1)-NM)/\beta_{PNP}]=I_{in}*[1+2/\beta_{PNP}]. \quad (9)$$

Therefore,

M+1−NM=−2, or M(1−N)=−3, so that the emitter area ratio N for the transistors 160 and 150 of the current mirror 155 may be expressed as:

$$N=1+3/M \quad (10).$$

Thus, in the example of FIG. 2, for a total of M=2 mirrored current output ports ($OUT_1$ and $OUT_1$), equation (10) reveals that the required emitter area ratio N ($A_{e160}/A_{e150}$) is 2.5, as described above.

As will be appreciated from the foregoing description, the base current error problem of conventional SLIC-installed current mirror circuits, that do not have sufficient voltage supply headroom to accommodate compensation circuit components, is effectively minimized by the multiple transistor polarity base current error correction architecture of the invention. This architecture includes complementary polarity base current error compensation mirror circuits coupled to a current mirror control node, that is referenced to the collector-emitter current path of an input transistor. To compensate for total number of base current error components in the output transistor-based mirror circuit, auxiliary transistors are coupled in the collector-emitter paths of the current mirror output transistors, which are referenced to a relatively large voltage well in excess of VCC, so that there is ample output current path headroom for the insertion of the auxiliary transistors. By summing and appropriately mirroring the base offset currents of these auxiliary transistors back to the control node, the output current mirror transistors are driven with a composite current that causes each of the output currents to be equal to the input current and effectively free of base current errors.

While I have shown and described an embodiment in accordance with the present invention, it is to be understood that the same is not limited thereto but is susceptible to numerous changes and modifications as known to a person skilled in the art. I therefore do not wish to be limited to the details shown and described herein, but intend to cover all changes and modifications as are obvious to one of ordinary skill in the art.

What is claimed is:

1. A current mirror circuit comprising:
an input port adapted to receive an input current;
at least one output port adapted to provide at least one output current therefrom:
a first polarity input transistor having an input electrode coupled to said input port, a control electrode coupled to receive a reference voltage, and an output electrode coupled to a second polarity transistor-based current mirror output circuit, which is operative to supply said at least one output current to said at least one output port in accordance with said input current; and a complementary polarity base current error compensation circuit coupled to said first polarity input transistor and to said second polarity transistor-based current mirror output circuit, and being operative to control said second polarity transistor-based current mirror output circuit in a manner that compensates for base current errors of said first polarity and input transistor second polarity transistors of said current mirror output at least one circuit.

2. A current mirror circuit according to claim 1, wherein said current mirror output circuit is operative to supply said at least one output current to said at least one output port in accordance with a drive current provided by a current mirror control node coupled to said output electrode of said input transistor, and wherein said complementary polarity base current error compensation circuit includes a first polarity transistor-associated compensation path coupled to said output electrode of said input transistor and being operative to couple to said control node a first base current error compensation current that compensates for a base current error of said first polarity input transistor, and a second polarity transistor-associated compensation path coupled to said current mirror output circuit and said control node, and being operative to couple to said control node a second base current error compensation current that compensates for base current errors of said second polarity transistors.

3. A current mirror circuit according to claim 2, wherein said first polarity transistor-associated compensation path includes a first polarity transistor-based current mirror circuit, and wherein said second polarity transistor-associated compensation path includes a second polarity transistor-based auxiliary coupling circuit coupled with said second polarity transistor-based current mirror output circuit, and a feedback current mirror circuit that is operative to supply said second base current error compensation current to said control node, in accordance with a prescribed mirror multiplication of a base current derived from said second polarity transistor-based auxiliary coupled circuit.

4. A current mirror circuit according to claim 1, wherein said at least one output port comprises a plurality of output ports from which plural output currents are supplied, and wherein said complementary polarity base current error compensation circuit is operative to control said second polarity transistor-based current mirror output circuit in a manner compensates said plural output currents for base current errors of said first and second polarity transistors of said current mirror circuit, and so that each of said plural output currents corresponds to said input current.

5. A current mirror circuit according to claim 4, wherein said current mirror output circuit is operative to supply said plural output currents to said plurality of output ports in accordance with a drive current provided by a current mirror control node coupled to said output electrode of said input transistor, and wherein said complementary polarity based current compensation circuit includes a first polarity transistor-associated compensation path coupled to said output electrode of said input transistor and being operative to couple to said control node a first base current error compensation current that compensates for a base current error of said first polarity input transistor, and a second polarity transistor-associated compensation path coupled to said current mirror output circuit and said control node, and being operative to couple to said control node a second base current error compensation current that compensates for base current errors of said second polarity transistors.

6. A current mirror circuit according to claim 5, wherein said first polarity transistor-associated compensation path includes a first polarity transistor-based current mirror circuit, and wherein said second polarity transistor-associated compensation path includes a second polarity transistor-based auxiliary coupling circuit coupled with said second polarity transistor-based current mirror output circuit, and a feedback current mirror circuit that is operative to supply said second base current error compensation current to said control node, in accordance with a prescribed mirror multiplication of a summation of base currents derived from said second polarity transistor-based auxiliary coupled circuit.

7. A current mirror circuit according to claim 6, wherein said prescribed mirror multiplication is defined in accordance with base error currents associated with the total mirrored output current produced by said the current mirror output circuit.

8. A method of generating a plurality of output currents in accordance with an input current comprising the steps of:

(a) coupling said input current to an input electrode of a first polarity input transistor having a control electrode coupled to receive a reference voltage, and an output electrode coupled to a second polarity transistor-based current mirror output circuit, which is operative to supply said plural output currents to a plurality of output ports in accordance with said input current; and (b) coupling with said first polarity input transistor and to said second polarity transistor-based current mirror output circuit, a base current error compensation circuit that is operative to supply to second polarity transistor-based current mirror output circuit a composite control current therefor that compensates for base current errors of said first polarity input transistor and at least one second polarity transistor of said current mirror output circuit.

9. A method according to claim 8, wherein said current mirror output circuit is operative to supply said plural output currents to said plurality of output ports in accordance with a drive current provided by a current mirror control node coupled to said output electrode of said input transistor, and wherein said complementary polarity based current compensation circuit includes a first polarity transistor-associated compensation path coupled to said output electrode of said input transistor and being operative to couple to said control node a first base current error compensation current that compensates for a base current error of said first polarity input transistor, and a second polarity transistor-associated compensation path coupled to said current mirror output circuit and said control node, and being operative to couple to said control node a second base current error compensation current that compensates for base current errors of said second polarity transistors.

10. A method according to claim 9, wherein said first polarity transistor-associated compensation path includes a first polarity transistor-based current mirror circuit, and wherein said second polarity transistor-associated compensation path includes a second polarity transistor-based auxiliary coupling circuit coupled with said second polarity transistor-based current mirror output circuit, and a feedback current mirror circuit that is operative to supply said second base current error compensation current to said control node, in accordance with a prescribed mirror multiplication of a summation of base currents derived from said second polarity transistor-based auxiliary coupled circuit.

11. A method according to claim 10, wherein said prescribed mirror multiplication is defined in accordance with base error currents associated with the total mirrored output current produced by said the current mirror output circuit.

* * * * *

UNITED STATES PATENT AND TRADEMARK OFFICE
CERTIFICATE OF CORRECTION

PATENT NO. : 6,344,776 B1  
DATED : February 5, 2002  
INVENTOR(S) : Leonel Ernesto Enriquez It is certified that error appears in the above-identified patent and that said Letters Patent is hereby corrected as shown below:

Title page,  
Item [75], delete "Leonal" insert -- Leonel --

Column 3,  
Line 28, delete "any a particular" insert -- any particular --

Column 6,  
Line 7, delete "in"

Column 7,  
Lines 10-12, delete "first polarity and input transistor second polarity transistors of said current mirror output at least one circuit" insert -- first polarity input transistor and at least one second polarity transistors of said current mirror output circuit --

Column 8,  
Line 15, delete "the"

Signed and Sealed this

Tenth Day of September, 2002

Attest:

JAMES E. ROGAN  
Attesting Officer  Director of the United States Patent and Trademark Office

UNITED STATES PATENT AND TRADEMARK OFFICE
CERTIFICATE OF CORRECTION

PATENT NO.    : 6,344,776 B1                                          Page 1 of 1
DATED         : February 5, 2002
INVENTOR(S)   : Leonel Ernesto Enriquez It is certified that error appears in the above-identified patent and that said Letters Patent is hereby corrected as shown below:

<u>Title page,</u>
Item [75], delete "Leonal" insert -- Leonel --

<u>Column 3,</u>
Line 28, delete "any a particular" insert -- any particular --

<u>Column 6,</u>
Line 7, delete "in"

<u>Column 7,</u>
Lines 10-12, "first polarity and input transistor second polarity transistors of said current mirror output at least one circuit" insert -- first polarity input transistor and at least one second polarity transistor of said current mirror output circuit --

<u>Column 8,</u>
Line 15, delete "the"

This certificate supersedes Certificate of Correction issued September 10, 2002.

Signed and Sealed this

Tenth Day of December, 2002

JAMES E. ROGAN
*Director of the United States Patent and Trademark Office*